(12) United States Patent
Hino et al.

(10) Patent No.: US 8,697,237 B2
(45) Date of Patent: Apr. 15, 2014

(54) THERMOSETTING RESIN COMPOSITION, METHOD OF MANUFACTURING THE SAME AND CIRCUIT BOARD

(71) Applicant: Panasonic Corporation, Kadoma (JP)

(72) Inventors: Hirohisa Hino, Kadoma (JP); Taro Fukui, Kadoma (JP); Hidenori Miyakawa, Osaka (JP); Atsushi Yamaguchi, Osaka (JP); Takayuki Higuchi, Osaka (JP)

(73) Assignee: Panasonic Corporation, Kadoma-shi (JP)

( * ) Notice: Subject to any disclaimer, the term of this patent is extended or adjusted under 35 U.S.C. 154(b) by 0 days.

(21) Appl. No.: 13/872,205

(22) Filed: Apr. 29, 2013

(65) Prior Publication Data

US 2013/0237645 A1    Sep. 12, 2013

Related U.S. Application Data

(62) Division of application No. 12/226,872, filed as application No. PCT/JP2007/066665 on Aug. 28, 2007, now abandoned.

(30) Foreign Application Priority Data

Aug. 28, 2006    (JP) ................................. 2006-231303

(51) Int. Cl.
| | | |
|---|---|---|
| *B32B 27/38* | (2006.01) | |
| *C08L 63/00* | (2006.01) | |
| *C08G 59/18* | (2006.01) | |
| *C08K 3/08* | (2006.01) | |
| *B32B 15/092* | (2006.01) | |

(52) U.S. Cl.
USPC ........... 428/413; 428/901; 523/455; 523/457; 523/459; 523/460

(58) Field of Classification Search
None
See application file for complete search history.

(56) References Cited

U.S. PATENT DOCUMENTS

| | | |
|---|---|---|
| 4,168,996 A | 9/1979 | Zado |
| 5,004,509 A | 4/1991 | Bristol |
| 5,131,962 A | 7/1992 | Minahara et al. |
| 5,297,721 A | 3/1994 | Schneider et al. |
| 5,569,433 A | 10/1996 | Chen et al. |
| 6,641,679 B2 | 11/2003 | Nishina et al. |
| 6,791,839 B2 | 9/2004 | Bhagwagar et al. |
| 6,796,482 B2 | 9/2004 | Wetz et al. |
| 2001/0002982 A1 | 6/2001 | Sarkhel et al. |
| 2003/0015575 A1 | 1/2003 | Yamaguchi et al. |
| 2005/0039824 A1 | 2/2005 | Nishina et al. |

FOREIGN PATENT DOCUMENTS

| | | |
|---|---|---|
| CN | 1392817 A | 1/2003 |
| JP | 54-81146 | 6/1979 |
| JP | 03184695 A | 8/1991 |
| JP | 04-313491 | 11/1992 |
| JP | 08-503168 | 4/1996 |
| JP | 2001170797 A | 6/2001 |
| JP | 2002-239785 | 8/2002 |
| JP | 2003-010997 | 1/2003 |
| JP | 2004-185884 | 7/2004 |
| JP | 2004-330269 | 11/2004 |
| JP | 2006199937 A | 8/2006 |
| JP | 2007-119750 | 5/2007 |

OTHER PUBLICATIONS

International Search Report mailed Oct. 9, 2007, issued on PCT/JP2007/066665.
Chinese Examination Report dated Oct. 18, 2010, issued for Chinese Patent Application No. 200780016532.2 and English translation thereof.

*Primary Examiner* — Michael J Feely
(74) *Attorney, Agent, or Firm* — Edwards Wildman Palmer LLP; James E. Armstrong, IV

(57) ABSTRACT

The invention relates to a thermosetting resin composition which includes a metal filler component, a fluxing component and a thermosetting resin binder. The metal filler component includes at least one of bismuth (Bi) and indium (In), and tin (Sn). The fluxing component, which at least one of a compound of structural formula (1) below and a compound of structural formula (2) below, is used.

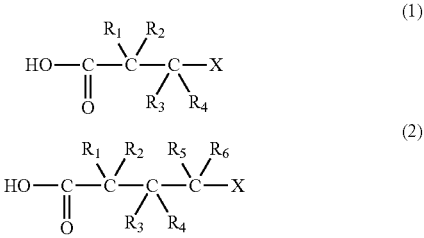

In the above formulas, $R_1$ to $R_6$ are each a hydrogen or alkyl group, and X is an organic group which has a lone electron pair or double bond π electrons and is capable of coordinating with a metal.

8 Claims, 2 Drawing Sheets

(a)

(b)

(a)

(b)

THERMOSETTING RESIN COMPOSITION, METHOD OF MANUFACTURING THE SAME AND CIRCUIT BOARD

CROSS REFERENCE TO RELATED APPLICATIONS

This application is a divisional application of U.S. application Ser. No. 12/226,872, filed Oct. 30, 2008, which is a U.S. National stage application pursuant to 35 U.S.C. §371 of International Application No. PCT/JP2007/066665 filed Aug. 28, 2007, which claims the right of priority under 35 U.S.C. §119 based on Japanese Patent Application No. 2006-231303 filed Aug. 28, 2006, the disclosures of which are expressly incorporated herein by reference in their entireties.

TECHNICAL FIELD

The present invention relates to a thermosetting resin composition, which can be used as a conductive paste for mounting components, particularly as a thermosetting low-temperature solder paste, to a method of producing such a composition, and to a circuit board on which components have been mounted using such a thermosetting resin composition.

BACKGROUND

Primary use is made today of materials known as "cream solders" for electron packaging applications (for example, see Patent Document 1). Cream solders are compositions which include solder particles, a fluxing component and a solvent. When a cream solder is heated in a reflow oven, the solder particles melt at the melting point and above. At an elevated temperature, the fluxing component removes the oxide film (oxide layer) at the surface of the solder particles, allowing the solder particles to coalesce and thus bringing the component mounting operation to completion. The result is a highly productive process capable of connecting numerous components at one time. Examples of fluxing components which are added include rosin constituents such as abietic acid, various amines and their salts, and high-melting organic acids such as sebacic acid and adipic acid.

Lead eutectic solder, which is a typical conventional solder, has a melting point of 183° C. However, the Sn—Ag—Cu solders typical of the lead-free solders that are starting to be used in keeping with the current trend toward the phasing out of lead, have melting points that are about 30° C. higher. Hence, in prior-art solder reflow processes, electronic packaging is carried out at elevated temperatures of up to 215 to 260° C.

Patent Document 1: Japanese Patent Application Laid-open No. 2004-185884

When electronic circuits which include components incapable of withstanding elevated temperatures of 215 to 260° C. are packaged, it is necessary to carry out a separate step in which only these components are mounted by carrying out spot soldering or are mounted using a silver paste or the like. Unfortunately, this has greatly lowered the productivity.

Conductive pastes which employ, as solder particles having a melting point lower than 215° C., the alloy Sn42/Bi58 (melting point, 139° C.) are known. However, the following problems are associated with the use of this low-melting solder.

(1) Because the above low-melting solder is relatively brittle compared to lead eutectic solders and Sn—Ag—Cu solders, it leaves something to be desired in terms of strength and toughness. When a component is attached by only a solder connection, there is a tendency for the component to fall off and for cracks to arise in the solder connection due to temperature cycling and shock.

(2) Conventional fluxing components dissociate at a high temperature and exhibit a strong chemical activity against metal oxides. However, under low-temperature reflow conditions such as the above, an effective fluxing action does not arise, making it difficult for the solder particles to coalesce even on melting.

One conceivable way to, resolve above problem (1) in particular is to use a thermosetting resin as the binder, disperse low-melting solder particles in this binder and carry out solder bonding, thereby having the component attached not only by the solder connection but also by the cured resin. Although this would be expected to provide large improvements in strength and toughness, there are no known and effective fluxing components that can be made to coexist during such a process.

DISCLOSURE OF THE INVENTION

The present invention was conceived in light of the above. The object of the invention is to provide a thermosetting resin composition which, in packaging electronic circuits that include components incapable of withstanding elevated temperatures, makes use of low-melting solder particles to enable batch reflow at a low temperature and enables electronic packaging of excellent strength and toughness.

The thermosetting resin composition according to claim 1 of the invention is characterized by comprising of a metal filler component, a fluxing component and a thermosetting resin binder, wherein the metal filler component including at least one of bismuth (Bi) and indium (In) is used, and the fluxing component, which is at least one of a compound of structural formula (1) below and a compound of structural formula (2) below, is used.

[C 1]

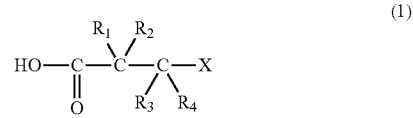

(1)

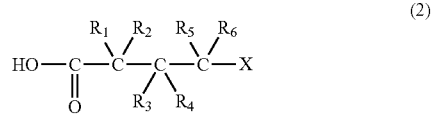

(2)

In the above formulas, $R_1$ to $R_6$ are each a hydrogen or alkyl group, and X is an organic group which has a lone electron pair or double bond π electrons and is capable of coordinating with a metal.

The thermosetting resin composition according to the invention is characterized, by having, in the composition described above, a Bi content of from 10 to 70 wt %, based on the total weight of the metal filler component.

The thermosetting resin composition according to the invention is characterized by having, in the composition described above, an In content of from 10 to 90 wt %, based on the total weight of the metal filler component.

The thermosetting resin composition according to the invention is characterized by having, in the composition described above, a Bi content of from 10 to 70 wt % and an In content of from 10 to 90 wt %, based on the total weight of the metal filler component.

The thermosetting resin composition according to the invention is characterized in that, in the composition described above, the metal filler component includes at least one metal selected from the group consisting of copper (Cu), silver (Ag) and nickel (Ni).

The thermosetting resin composition according to the invention is characterized in that, in the composition described above, X in the structural formula (1) or (2) is an organic group having at least any one of structural formulas (3) to (8) below.

[C 2]

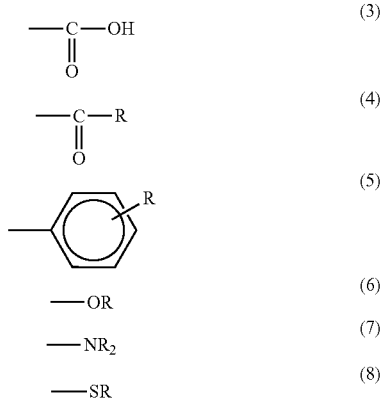

In the above formulas, R is a hydrogen or an alkyl group.

The thermosetting resin composition according to the invention is characterized in that, in the composition decribed above, the compound of the structural formula (1) or (2) is at least one selected from the group consisting of levulinic acid, glutaric acid, succinic acid, 5-ketohexanoic acid, 3-hydroxypropionic acid, 4-aminobutyric acid, 3-mercaptopropionic acid, 3-mercaptoisobutyric acid, 3-methylthiopropionic acid, 3-phenylpropionic acid, 3-phenylisobutyric acid and 4-phenylbutyric acid.

The thermosetting resin composition according to the invention is characterized in that, in the composition described above, an epoxy resin and a curing agent are used as the thermosetting resin binder.

The thermosetting resin composition according to the invention is characterized by including, in the composition described above, from 3 to 50 PHR of the fluxing component, based on the thermosetting resin binder.

The thermosetting resin composition according to the invention is characterized in that, in the composition described above, the thermosetting resin binder and the fluxing component are included in a total amount of from 5 to 30 wt %, based on the total weight of the composition.

The method of producing a thermosetting resin composition according to the invention is characterized by including: mixing and kneading a metal filler component which includes at least one of bismuth (bi) and indium (In), a fluxing component composed of at least one of a compound of structural formula (1) and a compound of structural formula (2), and a liquid epoxy resin; and then adding a curing agent.

The method of producing a thermosetting resin composition according to the invention is characterized by including: mixing a metal filler component including at least one of bismuth (Bi) and indium (In), a fluxing component composed of at least one of a compound of structural formula (1) and a compound of structural formula (2), and a solvent; removing the solvent by drying; and then adding an epoxy resin and a curing agent.

The circuit board according to the invention is characterized by being composed of an component bonded to a substrate, using the thermosetting resin composition described above or using a thermosetting resin composition produced by the method described above.

An advantage of the thermosetting resin composition according to the invention is that, in mounting electronic components incapable of withstanding elevated temperatures on a substrate, by using a metal filler component which includes at least one of bismuth (Bi) and indium (In), reflow soldering can be carried out at a lower temperature than before. Also, by using, as the fluxing component, at least one of a compound of above structural formula (1) and a compound of above structural formula (2), the oxide film on the surface of each solder particle composed of the metal filler component can be sufficiently removed, enabling the melting and coalescence of the metal filler component to progress. Moreover, by using a thermosetting resin binder, a strong resin film can be formed around the melted and coalesced metal filler component to reinforce it.

The invention described above enables a sufficient lowering of the melting point to be obtained.

The invention described above enables a sufficient lowering of the melting point to be obtained.

The invention described above enables a sufficient lowering of the melting point to be obtained.

The invention described above, by including copper or silver in the metal filler component, enables the mechanical properties of the solder alloy to be enhanced. Also, the inclusion of nickel in the tin-containing metal filler component enables the oxidation of tin to be suppressed.

The invention described above enables effective removal of oxide film from the metal filler component.

The invention described above enables even more effective removal of oxide film from the metal filler component.

The invention described above enables curing to be effected at a lower temperature and enables a higher adhesion to be achieved than when other resins are used.

The invention described above makes it possible to fully elicit the action of the fluxing component and enables a high degree of reinforcement after curing of the thermosetting resin composition to be achieved.

The invention described above enables a flowable thermosetting resin composition to be obtained. In addition, a resin layer composed of cured thermosetting resin binder that is free of voids forms around the melted and coalesced metal filler component. This resin layer enables sufficient reinforcement to be achieved, is able to prevent interference in the melting and coalescing of the metal filler component, and also makes it possible to achieve a sufficiently low connection resistance.

The method of producing a thermosetting resin composition described above enables thermosetting resin compositions capable of achieving the following effects to be obtained. That is, the fluxing component is adsorbed as a chelate at the surface of the metal filler component and, at the temperature at which the metal filler component melts, carboxyl groups in the fluxing component induce a reducing reaction with the metal oxide film, thereby aiding in the coalescence of the metal filler component. Also, the concentration of fluxing component that does not act effectively within the thermosetting resin binder is lowered, enabling the formation of a strong resin layer composed of cured thermosetting resin binder about the metal filler component. In addition, in the above method of production, by mixing and kneading the three components (metal filler component, fluxing component, liquid epoxy resin) prior to addition of the curing agent, a chelate of the metal filler component and the fluxing component can be efficiently formed. Also, because the curing agent has not yet been added at the time of kneading, it is possible to prevent a rise in the viscosity of the kneaded mixture.

The method of producing a thermosetting resin composition described above enables thermosetting resin compositions capable of achieving the following effects to be obtained. That is, the fluxing component is adsorbed as a chelate at the surface of the metal filler component and, at the temperature at which the metal filler component melts, carboxyl groups in the fluxing component induce a reducing reaction with the metal oxide film, thereby aiding in the coalescence of the metal filler component. Also, the concentration of fluxing component that does not act effectively within the thermosetting resin binder is lowered, enabling the formation of a strong resin layer composed of cured thermosetting resin binder about the metal filler component. Furthermore, a solvent is preferable to a liquid epoxy resin for increasing the surface wettability of the metal filler component, thus enabling the compatibility with the fluxing component to be further improved. Therefore, as noted above, when the three components (metal filler component, fluxing component, liquid epoxy resin) are initially mixed and kneaded, a chelate of the metal filler component and the fluxing component can be even more efficiently formed.

The circuit board described above makes it possible for the electronic component to achieve a high adhesion to the substrate, and also enables the resistance between the substrate and the components to be substantially lowered.

Figure 1:
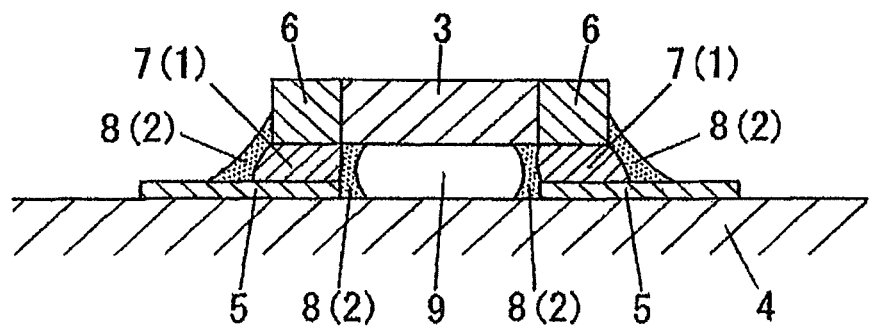
FIG. 1 shows cross-sectional views of one example of circuit boards according to the present invention.
Figure 1:
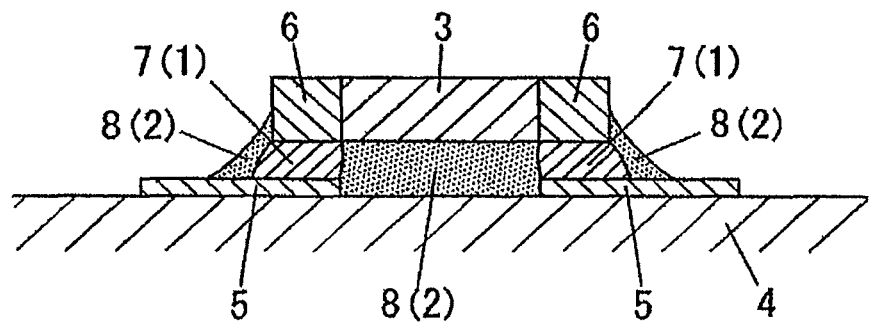

1 Metal filler component
2 Thermosetting resin binder
3 Component
4 Substrate

BEST MODE FOR CARRYING OUT THE INVENTION

Embodiments of the invention are described below.

The thermosetting resin composition according to the invention includes as essential components a metal filler component (solder particles), a fluxing component, and a thermosetting resin binder (matrix resin).

The metal filler component that is used includes at least one of bismuth or indium. For example, low-melting solders having compositions like those shown in Table 1 below may be used.

TABLE 1

| Sn (wt %) | Bi (wt %) | In (wt %) | Cu (wt %) | Ag (wt %) | Ni (wt %) | Melting point (° C.) |
|---|---|---|---|---|---|---|
| 43 | 57 | | | | | 139 |
| 48 | | 52 | | | | 120 |
| 42 | 57 | | | 1 | | 145 |
| 42.5 | 57 | | 0.5 | | | 140 |
| 42.995 | 57 | | | | 0.005 | 140 |
| 42.95 | 57 | | | | 0.05 | 140 |
| 42.45 | 57 | | 0.5 | | 0.05 | 140 |
| 47 | | 52 | | 1 | | 125 |
| 47.5 | | 52 | 0.5 | | | 121 |
| 47.995 | | 52 | | | 0.005 | 118 |
| 47.95 | | 52 | | | 0.05 | 118 |
| 47.45 | | 52 | 0.5 | | 0.05 | 121 |
| 33 | 57 | 10 | | | | 119 |
| 28 | 57 | 15 | | | | 109 |
| 23 | 57 | 20 | | | | 100 |
| 32 | 57 | 10 | | 1 | | 121 |
| 38 | 10 | 52 | | | | 110 |
| 33 | 15 | 52 | | | | 105 |
| 28 | 20 | 52 | | | | 100 |
| 40 | 50 | 10 | | | | 120 |
| 35 | 50 | 15 | | | | 110 |
| 30 | 50 | 20 | | | | 100 |
| 16 | 56 | 28 | | | | 80 |
| 26 | 50 | 24 | | | | 98 |
| 27.5 | 55 | 17.5 | | | | 100 |
| 6 | 70 | 24 | | | | 70 |
| 15 | 60 | 25 | | | | 79 |

Here, the bismuth content, based on the overall weight of the metal filler component, is preferably from 10 to 70 wt %, and more preferably from 50 to 70 wt %. At a bismuth content of less than 10 wt %, it may not be possible to achieve a sufficient melting point-lowering effect. At a bismuth content of more than 70 wt %, it may similarly not be possible to obtain a melting point-lowering effect.

The indium content, based on the overall weight of the metal filler component, is preferably from 10 to 90 wt %, and more preferably from 10 to 24.5 wt %. At an indium content of less than 10 wt %, it may not be possible to achieve a sufficient melting point-lowering effect. At an indium content of more than 90 wt %, it may similarly not be possible to obtain a melting point-lowering effect.

The metal filler component preferably includes at least one metal selected from the group consisting of copper, silver and nickel. By including copper or silver in the metal filler component, the mechanical properties of the solder alloy can be improved. By including nickel in the tin-containing metal filler component, the oxidation of tin can be suppressed.

When copper is included in the metal filler component, the copper content, based on the overall weight of the metal filler component, is preferably from 0.1 to 1.0 wt %, and more preferably from 0.5 to 0.7 wt %. At a copper content below 0.1 wt %, it may not be possible to achieve a sufficient mechanical property-improving effect. On the other hand, at a copper content of more than 1.0 wt %, the solder alloy shows a tendency to become brittle and the mechanical properties may decline.

When silver is included in the metal filler component, the silver content, based on the overall weight of the metal filler component, is preferably from 0.1 to 5 wt %. At a silver content below 0.1 wt %, it may not be possible to achieve a sufficient mechanical property-improving effect. On the other hand, at a silver content of more than 5 wt %, the solder alloy shows a tendency to become brittle and the mechanical properties may decline.

When nickel is included in a tin-containing metal filler component, the nickel content, based on the overall weight of the metal filler component, is preferably from 0.001 to 0.1 wt %, more preferably from 0.005 to 0.1 wt %, even more preferably from 0.01 to 0.1 wt %, and most preferably from 0.05 to 0.1 wt %. At a nickel content of less than 0.001 wt %, it may not be possible to fully achieve a tin oxidation-suppressing effect. On the other hand, at a nickel content of more than 0.1 wt %, a strong nickel oxide film forms and the melting point increases, as a result of which a tin oxidation-suppressing effect may not be achievable.

At least one of a compound of structural formula (1) below and a compound of structural formula (2) below is used as the fluxing component.

[C 3]

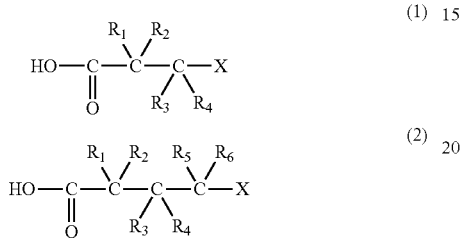

In the above formulas, $R_1$ to $R_6$ are each a hydrogen or alkyl group, and X is an organic group which has a lone electron pair or double bond π electrons and is capable of coordinating with a metal.

These compounds have a carboxyl group at the end and do not have a very large flux activity at room temperature. However, they form chelates like those of formulas (9) and (10) below, stably localize on the surface of low-temperature solder particles, and have the ability to effectively remove the oxide film from the surface of the metal filler component without exposure to elevated temperatures at which the proton completely dissociates. In formulas (9) and (10) below, M represents a metal such as bismuth, indium or tin; $R_1$ to $R_6$ are omitted.

[C 4]

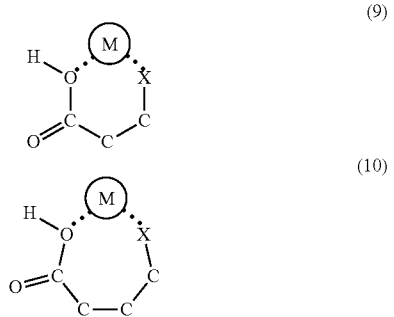

Here, X in above structural formula (1) or (2) is exemplified by groups which have a lone pair of electrons and are capable of forming a chelate, such as nitrogen, oxygen and sulfur atoms; organic groups having double bond π electrons between a carbon atom and a hetero atom, such as carbonyl, carboxyl, thiocarbonyl and imino groups; aromatic groups such as phenyl, pyridyl and imidazoyl groups; vinyl groups having a carbon-carbon double bond; and organic groups having conjugated double bonds.

Of these, X in above structural formula (1) or (2) is preferably an organic group having at least any one of structural formulas (3) to (8) below. In this way, the oxide film on the metal filler component can be more effectively removed than when X is another organic group.

[C 5]

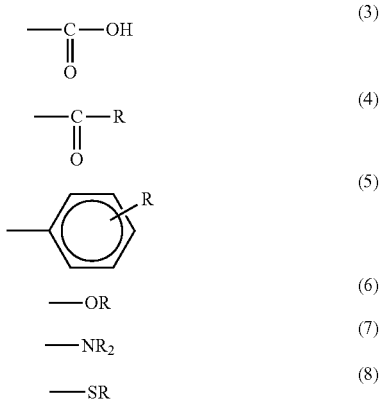

In the above formulas, R is a hydrogen or an alkyl group.

It is especially preferable for the compound of above structural formula (1) or (2) to be at least one selected from the group consisting of levulinic acid, glutaric acid, succinic acid, 5-ketohexanoic acid, 3-hydroxypropionic acid, 4-aminobutyric acid, 3-mercaptopropionic acid, 3-mercaptoisobutyric acid, 3-methylthiopropionic acid, 3-phenylpropionic acid, 3-phenylisobutyric acid and 4-phenylbutyric acid. The compound of structural formula (1) or (2) is thus able to more effectively remove the oxide film on the metal filler component than other compounds.

In the present invention, other fluxing components that are commonly used may be employed together with at least one of the compound of above structural formula (1) and the compound of above structural formula (2).

Resins that may be used as the thermosetting resin binder include, but are not limited to, epoxy resins, polyimide resins, cyanate ester resins, ester resins, benzoxazine resins and polyester resins. To mount components and provide reinforcement at a lower temperature than conventional solder reflow, the resin must be sufficiently curable at that temperature. From the standpoint of low-temperature curability and adhesion, the use of an epoxy resin and a curing agent is preferred. When an epoxy resin and a curing agent are used as the thermosetting resin binder, a curing agent and, if necessary, a curing accelerator—which is an ingredient that assists curing by the curing agent—is formulated with the epoxy resin (generally a liquid epoxy resin). Examples of liquid epoxy resins that may be used here include bisphenol A epoxy resins, bisphenol F epoxy resins, hydrogenated bisphenol A epoxy resins, hydrogenated bisphenol F epoxy resins, alicyclic epoxy resins, novolak epoxy resins and naphthalene epoxy resins. A solid epoxy resin that has been rendered liquid by concomitant use is also effective. Examples of solid epoxy resins that may be used include biphenyl-type epoxy resins, dicyclopentadiene-type epoxy resins and epoxy resins having a triazine skeleton. Curing agents that may be used include acid anhydrides, phenol novolak, various thiol compounds, various amines, dicyandiamide, imidazoles, metal complexes, and adduct compounds thereof, such as adduct-modified polyamines. Curing accelerators that may be used include various imidazoles, various amines, various phosphorus compounds, metal complexes such as iron acetylacetonate, and adduct compounds thereof.

It is preferable for the thermosetting resin composition to include from 3 to 50 PHR of the fluxing component, based on the thermosetting resin binder. At a fluxing component content of less than 3 PHR, the concentration is too low, which may make it impossible for the fluxing component to exhibit sufficient effects. As a result, melting and coalescing of the metal filler component may be hindered, possibly increasing the connection resistance. On the other hand, if the content of the fluxing component exceeds 50 PHR, the cured thermosetting resin composition may have residual tack, which may make it impossible to achieve a sufficiently high degree of reinforcement.

Also, it is preferable for the thermosetting resin binder and the fluxing component to be included in a combined amount of from 5 to 30 wt %, based on the overall weight of the thermosetting resin composition. If the combined amount of thermosetting resin binder and the fluxing component is less than 5 wt %, a putty-like or powdery state results, which may make it impossible to obtain a flowable thermosetting resin composition. Also, after the metal filler component melts and coalesces, a resin layer composed of cured thermosetting resin binder forms thereabout. Because this resin layer contains many voids, it may be impossible to achieve sufficient reinforcement with such a resin layer. On the other hand, if the thermosetting resin binder and the fluxing component are included in a combined amount of more than 30 wt %, the proportion of the metal filler component may be too low, which may hinder the melting and coalescence thereof or make it impossible to achieve a sufficiently low connection resistance.

Aside from the above essential components, the thermosetting resin composition of the invention may also include commonly used modifiers, additives and the like. In addition, a low-melting solvent or plasticizer may also be added for the purpose of lowering the viscosity of the thermosetting resin composition and conferring flowability. Moreover, it is also effective to add hardened castor oil, stearamide or the like as a thixotropic agent for retaining the printed shape.

The thermosetting resin composition may be produced in the following way. That is, the thermosetting resin composition may be produced by mixing and kneading a metal filler component which includes one or both of bismuth and indium, a fluxing component composed of a compound having above structural formula (1) and/or a compound having above structural formula (2), and a liquid epoxy resin, then adding a curing agent.

In this way, the four components—i.e., the metal filler component, the fluxing component, the liquid epoxy resin and the curing agent—are not mixed and kneaded together at one time. Instead, prior to adding the curing agent, three of the components—i.e., the metal filler component, the fluxing component and the liquid epoxy resin—are mixed and kneaded together, in this way making it possible to efficiently form chelates of the metal filler component and the fluxing component. To more efficiently carry out chelate formation, prior to adding the curing agent, it is desirable to allow the kneaded mixture of the above three components to stand for one full day so that it cools to room temperature. When the proportion of the metal filler component is high, the temperature of the kneaded material may rise due to frictional heat during kneading. However, at the time of such kneading, because the curing agent has not yet been added, the kneaded material can be prevented from thickening. That is, by adding at the end a curing agent which elicits a curing reaction with the epoxy resin, thickening associated with the epoxy resin reaction in the production step can be prevented. The reason for initially mixing and kneading the liquid epoxy resin together with the metal filler component and the fluxing component is to enhance the surface wettability of the metal filler component by the liquid epoxy resin.

Alternatively, the thermosetting resin composition may be produced in the following way. That is, the thermosetting resin composition may be produced by mixing together a metal filler component which includes one or both of bismuth and indium, a fluxing component composed of a compound of structural formula (1) above and/or a compound of structural formula (2) above, and a solvent such as methyl ethyl ketone (MEK), then removing this solvent by drying, and subsequently adding an epoxy resin and a curing agent. A solvent is better able than a liquid epoxy resin to improve the surface wettability of the metal filler component, and thus further improves the compatibility with the fluxing component. As a result, by initially mixing and kneading three components—namely, the metal filler component, the fluxing component and the solvent, a chelate of the metal filler component and the fluxing component can be even more efficiently formed.

In use of these production methods thus described, a thermosetting resin composition, which provides following effects, can be obtained. More specifically, the fluxing component is absorbed, as a chelate, in the surface of the metal filler component and the carboxyl group in the fluxing component induces a reduction reaction with a metal oxide film at a temperature at which the metal filler component melts, thereby facilitating integration of the metal filler component, and reducing the concentration of the fluxing component that does not act effectively in a thermosetting resin binder comprising an epoxy resin a curing agent. By this, a resin layer with a high strength formed of a cured product of a thermosetting resin binder can be formed around the integrated thermosetting resin binder.

Circuit boards like those shown in FIG. 1 can be obtained by using a thermosetting resin composition obtained as described above to bond a component 3 to a substrate 4. That is, in a case where a surface mount chip component is used as the component 3 and a printed circuit board such as FR-4 is used as the substrate 4, by interposing the above thermosetting resin composition between pads 5 provided on the printed circuit board and chip component terminals 6 and carrying out reflow soldering, the chip component can be mounted on the printed circuit board. To illustrate more specifically, the circuit board shown in FIG. 1(a) has a component 3 which was mounted thereon after each pad 5 was individually coated with the thermosetting resin composition. An air layer 9 (cavity) has been formed between the component 3 and the substrate 4. The circuit board shown in FIG. 1(b) does not have the above-described air layer 9 formed thereon. Here, instead of the thermosetting resin composition being coated individually on each pad 5, the front side of the circuit board where the component 3 is to be mounted was coated with the thermosetting resin composition, and the component 3 was mounted thereon. Thus, in the circuit board shown in FIG. 1(b), because an air layer 9 is not formed, the task of subsequently applying an underfill resin can be eliminated, in addition to which a higher adhesion of the component 3 to the substrate 4 can be achieved.

Figure 2:
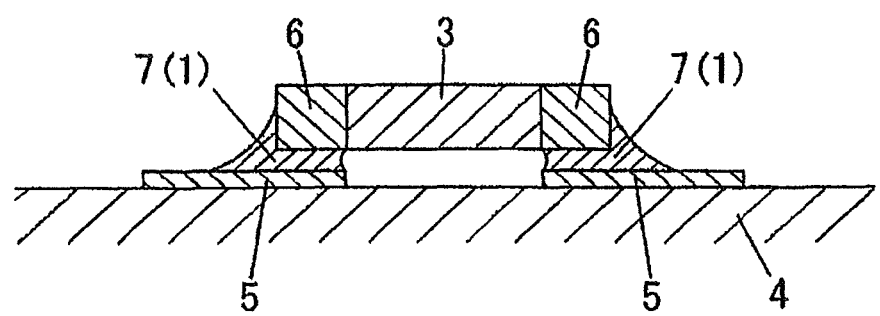
FIG. 2 shows circuit boards according to the prior art, (a) and (b) both being cross-sectional views thereof.
Figure 2:
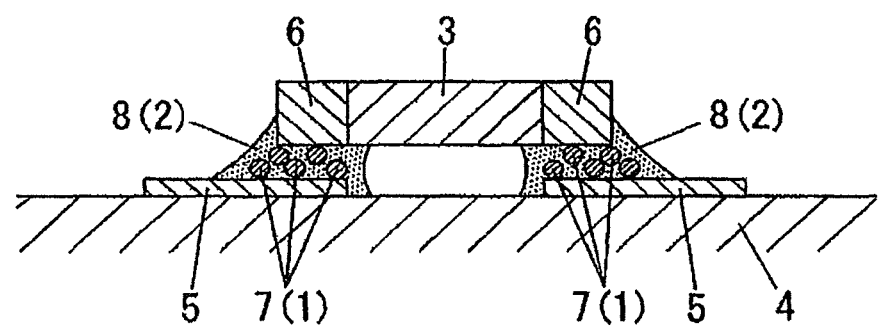

FIG. 2 shows conventional circuit boards. That is, the circuit board shown in FIG. 2(a) is one in which a component 3 has been bonded to a substrate 4 using a metal filler component 1 such as Sn42/Bi58 alloy (melting point, 139° C.), but not using a thermosetting resin binder. The circuit board shown in FIG. 2(b) is one in which a component 3 has been bonded to a substrate 4 using a metal filler component 1 such as Sn42/Bi58 alloy (melting point, 139° C.) and a thermosetting resin binder 2, but not using a fluxing component of above structural formula (1) or (2).

In the circuit board shown in FIG. 2(a), because a thermosetting resin binder 2 is not used, the component 3 is attached to the substrate 4 with only the solder connection using the metal filler component 1. As a result, there is a tendency for the component 3 to fall off the substrate 4 and for cracks to form in the solder connection 7 due to temperature cycling and shock. Also, when the metal filler component 1 in the solder connection 7 re-melts, the position of the component 3 on the substrate 4 may shift. To address this problem, in the circuit board shown in FIG. 1, a strong resin layer 8 obtained from the thermosetting resin binder 2 has formed around the solder connection 7 obtained from the metal filler component 1, as a result of which the component 3 does not fall off the substrate 4 and cracks do not arise in the solder connection 7 due to temperature cycling and shock. Moreover, even should the metal filler component 1 making up the solder connection 7 re-melt, because the resin layer 8 around it does not re-melt, no change will occur in the position of the component 3 on the substrate 4.

In the circuit board shown in FIG. 2(b), although a thermosetting resin binder 2 is used, because an effective fluxing component is not used, the oxide film on the surface of each solder particle making up the metal filler component 1 cannot be adequately removed. As a result, the melting and coalescence of the metal filler component 1 is impeded and the resistance value between the component 3 and the substrate 4 increases. To address this problem, in the circuit board shown in FIG. 1, a fluxing component of a compound of structural formula (1) above and/or a compound of structural formula (2) above is used, enabling the oxide film on the surface of each solder particle making up the metal filler component 1 to be adequately removed, which in turn promotes the melting and coalescence of the metal filler component 1 and makes it possible to greatly lower the resistance value between the component 3 and the substrate 4. Specifically, it is possible to achieve a very small resistance value of 15 mΩ or less.

EXAMPLES

The invention is illustrated more fully by way of the following examples.

Example 1

Sn16/Bi56/In28 (metal filler component No. 23 in Table 2 below) was used as the metal filler component. The solder particles made of this metal filler component had an average particle size of 15 μm, and the melting point was 80° C.

Levulinic acid was used as the fluxing component.

The liquid epoxy resin YD128 (produced by Tohto Kasei Co., Ltd.) and the curing agent Fujicure FXR-1080 (produced by Fuji Kasei Kogyo Co., Ltd.) were used as the thermosetting resin binder.

The above metal filler component (85 parts by weight), fluxing component (2 parts by weight), liquid epoxy resin (11 parts by weight) and curing agent (2 parts by weight) were uniformly mixed and kneaded using a dispersion mixer, thereby forming a thermosetting resin composition.

The above thermosetting resin composition was then screen-printed onto gold-plated pads on the FR-4 substrate. The thickness of the thermosetting resin composition applied to the pads was about 70 μm. This substrate was placed in a 100° C. (metal filler component No. 23 melting point of 80° C.+20° C.) oven and treated for 10 minutes.

The substrate was subsequently removed from the oven and the appearance of the cured thermosetting resin composition that had formed on the pads was examined under a microscope.

As a result, a completely separated two-layer state was observed in which the individual solder particles making up the metal filler component had melted and coalesced into a metal mass and were surrounded by thermosetting resin binder containing no solder particles. Moreover, the resin layer surrounding the metal filler component that had melted and coalesced into a metal mass was clear and tack-free.

In addition, using a 1608 chip with a resistance of 0Ω as the component 3, and using a FR-4 substrate as the substrate 4, the above-described thermosetting resin composition was interposed between the terminals 6 of the component 3 and the pads 5 provided on the substrate 4, and reflow soldering was carried out by heating in a reflow oven under solder reflow conditions consisting of a maximum temperature of 100° C. (metal filler component No. 23 melting point 80° C.+20° C.), thereby manufacturing a circuit board like that shown in FIG. 1.

Measurement of the resistance between the component 3 and the substrate 4 (component connection resistance) on the circuit board thus obtained yielded a value of 2 mΩ. Adhesion (chip component shear strength) of the component 3 to the substrate 4 was measured and found to be 2.5 kgf.

Example 2

Aside from using glutaric acid as the fluxing component, a thermosetting resin composition and a circuit board were produced in the same way as in Example 1, and the performance was evaluated.

Example 3

Aside from using succinic acid as the fluxing component, a thermosetting resin composition and a circuit board were produced in the same way as in Example 1, and the performance was evaluated.

Example 4

Aside from using 5-ketohexanoic acid as the fluxing component, a thermosetting resin composition and a circuit board were produced in the same way as in Example 1, and the performance was evaluated.

Example 5

Aside from using 3-hydroxypropionic acid as the fluxing component, a thermosetting resin composition and a circuit board were produced in the same way as in Example 1, and the performance was evaluated.

Example 6

Aside from using 4-aminobutyric acid as the fluxing component, a thermosetting resin composition and a circuit board were produced in the same way as in Example 1, and the performance was evaluated.

Example 7

Aside from using 3-mercaptopropionic acid as the fluxing component, a thermosetting resin composition and a circuit board were produced in the same way as in Example 1, and the performance was evaluated.

Example 8

Aside from using 3-mercaptoisobutyric acid as the fluxing component, a thermosetting resin composition and a circuit board were produced in the same way as in Example 1, and the performance was evaluated.

Example 9

Aside from using 3-methylthiopropionic acid as the fluxing component, a thermosetting resin composition and a circuit board were produced in the same way as in Example 1, and the performance was evaluated.

Example 10

Aside from using 3-phenylpropionic acid as the fluxing component, a thermosetting resin composition and a circuit board were produced in the same way as in Example 1, and the performance was evaluated.

Example 11

Aside from using 3-phenylisobutyric acid as the fluxing component, a thermosetting resin composition and a circuit board were produced in the same way as in Example 1, and the performance was evaluated.

Example 12

Aside from using 4-phenylbutyric acid as the fluxing component, a thermosetting resin composition and a circuit board were produced in the same way as in Example 1, and the performance was evaluated.

Example 13

Aside from using levulinic acid (1 part by weight) and 4-phenylbutyric acid (1 part by weight) as the fluxing component, a thermosetting resin composition and a circuit board were produced in the same way as in Example 1, and the performance was evaluated.

Example 14

Aside from using levulinic acid (0.5 part by weight) and abietic acid (1 part by weight) as the fluxing component, a thermosetting resin composition and a circuit board were produced in the same way as in Example 1, and the performance was evaluated.

Example 15

Aside from using levulinic acid (3 parts by weight) and 4-phenylbutyric acid (3 parts by weight) as the fluxing component, a thermosetting resin composition and a circuit board were produced in the same way as in Example 1, and the performance was evaluated.

Example 16

Aside from using 12 parts by weight of the cyanate ester resin L-10 (produced by Lonza) and 0.1 part by weight of iron acetylacetonate as the thermosetting resin binder, a thermosetting resin composition and a circuit board were produced in the same way as in Example 1, and the performance was evaluated.

Example 17

Sn16/Bi56/In28 (metal filler component No. 23 in Table 2 below) was used as the metal filler component. The solder particles made of this metal filler component had an average particle size of 15 μm, and the melting point was 80° C.

Levulinic acid was used as the fluxing component.

The liquid epoxy resin YD128 (produced by Tohto Kasei Co., Ltd.) and the curing agent Fujicure FXR-1080 (produced by Fuji Kasei Kogyo Co., Ltd.) were used as the thermosetting resin binder.

The above metal filler component (85 parts by weight), fluxing component (1 part by weight) and liquid epoxy resin (6 parts by weight) were uniformly mixed and kneaded using a dispersion mixer, and the kneaded material was left to stand for one full day. In a separate procedure, the above curing agent (2 parts by weight) and the liquid epoxy resin (5 parts by weight) were mixed to produce a composition, which was then added to the above kneaded material. The combined material was uniformly mixed to given a thermosetting resin composition. Aside from using this thermosetting resin composition, a circuit board was produced in the same way as in Example 1, and the performance was evaluated.

Example 18

Sn16/Bi56/In28 (metal filler component No. 23 in Table 2 below) was used as the metal filler component. The solder particles made of this metal filler component had an average particle size of 15 μm, and the melting point was 80° C.

Levulinic acid was used as the fluxing component.

The liquid epoxy resin YD128 (produced by Tohto Kasei Co., Ltd.) and the curing agent Fujicure FXR-1080 (produced by Fuji Kasei Kogyo Co., Ltd.) were used as the thermosetting resin binder.

In addition, methyl ethyl ketone (MEK) was used as the solvent.

The above metal filler component (85 parts by weight), fluxing component (1 part by weight) and solvent (30 parts by weight) were uniformly mixed, following which the solvent was removed by drying using a vacuum dryer. Next, the above liquid epoxy resin (11 parts by weight) and curing agent (2 parts by weight) were added to the mixture, and the combined material was uniformly mixed using a dispersion mixer, thereby forming a thermosetting resin composition. Aside from using this thermosetting resin composition, a circuit board was produced in the same way as in Example 1, and the performance was evaluated.

Example 19

Aside from using 8 parts by weight of levulinic acid as the fluxing component, a thermosetting resin composition and a circuit board were produced in the same way as in Example 1, and the performance was evaluated.

Examples 20 to 45

Aside from using metal filler components No. 1 to No. 22 and No. 24 to No. 27 in Table 2 below as the metal filler component, setting the oven temperature to the respective curing temperatures (the respective metal filler component melting point temperature+20° C.) shown in Table 2, and setting the maximum temperatures during reflow soldering to the respective curing temperatures (the respective metal filler component melting point temperature+20° C.) in Table 2, thermosetting resin compositions and circuit boards were produced in the same way as in Example 1, and the performance in each case was evaluated. The average particle size of the solder particles making up metal filler components No. 1 to No. 22 and No. 24 to No. 27 was 15 µm in each case.

Comparative Example 1

Aside from using abietic acid (2 parts by weight) as the fluxing component, a thermosetting resin composition and a circuit board were produced in the same way as in Example 1, and the performance was evaluated.

Comparative Example 2

Aside from using sebacic acid (2 parts by weight) as the fluxing component, a thermosetting resin composition and a circuit board were produced in the same way as in Example 1, and the performance was evaluated.

Comparative Example 3

Aside from not using a fluxing component, a thermosetting resin composition and a circuit board were produced in the same way as in Example 1, and the performance was evaluated.

Comparative Example 4

Aside from not using a thermosetting resin binder, a thermosetting resin composition and a circuit board were produced in the same way as in Example 1, and the performance was evaluated.

Comparative Example 5

Aside from using silver particles (85 parts by weight) as the metal filler component, a thermosetting resin composition and a circuit board were produced in the same way as in Example 1, and the performance was evaluated.

The above results are shown in Table 3 below.

TABLE 2

| Metal filler component | Sn (wt %) | Bi (wt %) | In (wt %) | Cu (wt %) | Ag (wt %) | Ni (wt %) | Melting point (° C.) | Curing temperature (° C.) |
|---|---|---|---|---|---|---|---|---|
| No. 1 | 43 | 57 | | | | | 139 | 159 |
| No. 2 | 48 | | 52 | | | | 120 | 140 |
| No. 3 | 42 | 57 | | | 1 | | 145 | 165 |
| No. 4 | 42.5 | 57 | | 0.5 | | | 140 | 160 |
| No. 5 | 42.995 | 57 | | | | 0.005 | 140 | 160 |
| No. 6 | 42.95 | 57 | | | | 0.05 | 140 | 160 |
| No. 7 | 42.45 | 57 | | 0.5 | | 0.05 | 140 | 160 |
| No. 8 | 47 | | 52 | | 1 | | 125 | 145 |
| No. 9 | 47.5 | | 52 | 0.5 | | | 121 | 141 |
| No. 10 | 47.995 | | 52 | | | 0.005 | 118 | 138 |
| No. 11 | 47.95 | | 52 | | | 0.05 | 118 | 138 |
| No. 12 | 47.45 | | 52 | 0.5 | | 0.05 | 121 | 141 |
| No. 13 | 33 | 57 | 10 | | | | 119 | 139 |
| No. 14 | 28 | 57 | 15 | | | | 109 | 129 |
| No. 15 | 23 | 57 | 20 | | | | 100 | 120 |
| No. 16 | 32 | 57 | 10 | | 1 | | 121 | 141 |
| No. 17 | 38 | 10 | 52 | | | | 110 | 130 |
| No. 18 | 33 | 15 | 52 | | | | 105 | 125 |
| No. 19 | 28 | 20 | 52 | | | | 100 | 120 |
| No. 20 | 40 | 50 | 10 | | | | 120 | 140 |
| No. 21 | 35 | 50 | 15 | | | | 110 | 130 |
| No. 22 | 30 | 50 | 20 | | | | 100 | 120 |
| No. 23 | 16 | 56 | 28 | | | | 80 | 100 |
| No. 24 | 26 | 50 | 24 | | | | 98 | 118 |
| No. 25 | 27.5 | 55 | 17.5 | | | | 100 | 120 |
| No. 26 | 6 | 70 | 24 | | | | 70 | 90 |
| No. 27 | 15 | 60 | 25 | | | | 79 | 99 |

TABLE 3

| | EX 1 | EX 2 | EX 3 | EX 4 | EX 5 | EX 6 | EX 7 | EX 8 | EX 9 | EX 10 |
|---|---|---|---|---|---|---|---|---|---|---|
| Metal filler component No. | No. 23 | No. 23 | No. 23 | No. 23 | No. 23 | No. 23 | No. 23 | No. 23 | No. 23 | No. 23 |
| Fluxing component (PHR) | 15.4 | 15.4 | 15.4 | 15.4 | 15.4 | 15.4 | 15.4 | 15.4 | 15.4 | 15.4 |
| Solder particle coalescence | VG | VG | Good | VG | Good | VG | VG | Fair | Good | Good |
| Resin cure | tack-free | tack-free | tack-free | tack-free | tack-free | tack-free | tack-free | tack-free | tack-free | tack-free |

TABLE 3-continued

| | | | | | | | | | | |
|---|---|---|---|---|---|---|---|---|---|---|
| Component connection resistance | 2 mΩ | 3 mΩ | 7 mΩ | 4 mΩ | 8 mΩ | 5 mΩ | 5 mΩ | 10 mΩ | 9 mΩ | 8 mΩ |
| Chip component shear strength | 2.5 kgf | 2.5 kgf | 1.5 kgf | 2.1 kgf | 1.5 kgf | 2.3 kgf | 2.5 kgf | 1.0 kgf | 1.3 kgf | 1.5 kgf |

| | EX 11 | EX 12 | EX 13 | EX 14 | EX 15 | EX 16 | EX 17 | EX 18 | EX 19 | EX 20 |
|---|---|---|---|---|---|---|---|---|---|---|
| Metal filler component No. | No. 23 | No. 23 | No. 23 | No. 23 | No. 23 | No. 23 | No. 23 | No. 23 | No. 23 | No. 1 |
| Fluxing component (PHR) | 15.4 | 15.4 | 15.4 | 11.5 | 46.2 | 16.5 | 7.7 | 7.7 | 61.5 | 15.4 |
| Solder particle coalescence | Fair | VG | VG | Good | VG | Good | VG | Good | VG | VG |
| Resin cure | tack-free | tack-free | tack-free | tack-free | tack-free | tack-free | tack-free | tack-free | residual tack | tack-free |
| Component connection resistance | 11 mΩ | 5 mΩ | 6 mΩ | 15 mΩ | 5 mΩ | 12 mΩ | 3 mΩ | 12 mΩ | 2 mΩ | 15 mΩ |
| Chip component shear strength | 1.0 kgf | 2.5 kgf | 2.5 kgf | 1.4 kgf | 2.5 kgf | 1.5 kgf | 2.1 kgf | 1.8 kgf | 1.8 kgf | 1.0 kgf |

| | EX 21 | EX 22 | EX 23 | EX 24 | EX 25 | EX 26 | EX 27 | EX 28 | EX 29 | EX 30 |
|---|---|---|---|---|---|---|---|---|---|---|
| Metal filler component No. | No. 2 | No. 3 | No. 4 | No. 5 | No. 6 | No. 7 | No. 8 | No. 9 | No. 10 | No. 11 |
| Fluxing component (PHR) | 15.4 | 15.4 | 15.4 | 15.4 | 15.4 | 15.4 | 15.4 | 15.4 | 15.4 | 15.4 |
| Solder particle coalescence | VG | VG | VG | VG | VG | VG | VG | VG | VG | VG |
| Resin cure | tack-free | tack-free | tack-free | tack-free | tack-free | tack-free | tack-free | tack-free | tack-free | tack-free |
| Component connection resistance | 6 mΩ | 12 mΩ | 15 mΩ | 15 mΩ | 15 mΩ | 15 mΩ | 5 mΩ | 6 mΩ | 7 mΩ | 8 mΩ |
| Chip component shear strength | 3.0 kgf | 1.2 kgf | 1.3 kgf | 1.0 kgf | 1.1 kgf | 1.2 kgf | 3.1 kgf | 2.8 kgf | 2.8 kgf | 3.0 kgf |

| | EX 31 | EX 32 | EX 33 | EX 34 | EX 35 | EX 36 | EX 37 | EX 38 | EX 39 | EX 40 |
|---|---|---|---|---|---|---|---|---|---|---|
| Metal filler component No. | No. 12 | No. 13 | No. 14 | No. 15 | No. 16 | No. 17 | No. 18 | No. 19 | No. 20 | No. 21 |
| Fluxing component (PHR) | 15.4 | 15.4 | 15.4 | 15.4 | 15.4 | 15.4 | 15.4 | 15.4 | 15.4 | 15.4 |
| Solder particle coalescence | VG | VG | VG | VG | VG | VG | VG | VG | VG | VG |
| Resin cure | tack-free | tack-free | tack-free | tack-free | tack-free | tack-free | tack-free | tack-free | tack-free | tack-free |
| Component connection resistance | 7 mΩ | 11 mΩ | 10 mΩ | 9 mΩ | 9 mΩ | 8 mΩ | 7 mΩ | 5 mΩ | 10 mΩ | 9 mΩ |
| Chip component shear strength | 3.0 kgf | 1.5 kgf | 1.8 kgf | 2.0 kgf | 1.8 kgf | 2.2 kgf | 2.4 kgf | 2.6 kgf | 1.7 kgf | 1.8 kgf |

| | EX 41 | EX 42 | EX 43 | EX 44 | EX 45 | CE 1 | CE 2 | CE 3 | CE 4 | CE 5 |
|---|---|---|---|---|---|---|---|---|---|---|
| Metal filler component No. | No. 22 | No. 24 | No. 25 | No. 26 | No. 27 | No. 23 | No. 23 | No. 23 | No. 23 | — |

TABLE 3-continued

| | | | | | | | | | | |
|---|---|---|---|---|---|---|---|---|---|---|
| Fluxing component (PHR) | 15.4 | 15.4 | 15.4 | 15.4 | 15.4 | 15.4 | 15.4 | 0 | — | 15.4 |
| Solder particle coalescence | VG | VG | VG | VG | VG | Poor | Poor | Poor | Fair | Poor |
| Resin cure | tack-free | tack-free | tack-free | tack-free | tack-free | tack-free | tack-free | tack-free | powdery | tack-free |
| Component connection resistance | 5 mΩ | 5 mΩ | 6 mΩ | 35 mΩ | 20 mΩ | 100 MΩ | 100 MΩ | 100 MΩ | not measurable | 0.5 mΩ |
| Chip component shear strength | 2.0 kgf | 2.3 kgf | 1.5 kgf | 0.8 kgf | 1.0 kgf | 0.2 kgf | 0.2 kgf | 0.2 kgf | | 0.2 kgf |

Solder particle coalescence was rated according to the following criteria.

ⓧ: All of the solder particles have coalesced into spheres, and no solder particles whatsoever are observable in the resin layer surrounding the spheres.

○: Substantially all of the solder particles have coalesced into spheres, but a few solder particles are observable in the resin layer surrounding the spheres.

Δ: A large portion of the solder particles have coalesced into spheres, but many solder particles are observable in the resin layer surrounding these spheres.

x: No solder particles that have coalesced are observable.

Also, in above Table 3, the fluxing component (PHR) was calculated as follows:

(parts by weight of fluxing component)/(parts by weight of epoxy resin+parts by weight of curing agent)×100

The invention claimed is:

1. A thermosetting resin composition comprising:
a metal filler component;
a fluxing component; and
a thermosetting resin binder of an epoxy resin,
wherein
said thermosetting resin binder further includes a curing agent,
said metal filler component includes both bismuth (Bi) and indium (In),
said bismuth (Bi) included in the range of 15 to 56 wt %, based upon the overall weight of said metal filler component,
said indium (In) included in the range of 15 to 52 wt %, based upon the overall weight of said metal filler component,
said fluxing component includes levulinic acid, and
said thermosetting resin composition includes from 15.4 to 50 PHR of the fluxing component, based on the thermosetting resin binder.

2. The thermosetting resin composition of claim 1, wherein the metal filler component includes tin (Sn).

3. The thermosetting resin composition of claim 1, wherein the metal filler component includes silver (Ag).

4. The thermosetting resin composition of claim 1, which includes the thermosetting resin binder and the fluxing component in a total amount of from 5 to 30 wt %, based on the total weight of the composition.

5. A method of producing the thermosetting resin composition of claim 1, the method comprising: mixing and kneading the metal filler component, the fluxing component, and epoxy resin; and then adding the curing agent, wherein the epoxy resin is a liquid epoxy resin.

6. A circuit board comprising a component bonded to a substrate, wherein the bond is formed by the thermosetting resin composition produced by the method of claim 5.

7. A method of producing the thermosetting resin composition of claim 1; the method comprising: mixing the metal filler component, the fluxing component, and a solvent; removing the solvent by drying; and then adding the epoxy resin and the curing agent.

8. A circuit board comprising a component bonded to a substrate, wherein the bond is formed by the thermosetting resin composition produced by the method of claim 7.

* * * * *